(12) United States Patent
Gardien et al.

(10) Patent No.: US 10,391,865 B2
(45) Date of Patent: Aug. 27, 2019

(54) ELECTRICAL SYSTEM COMPRISING A CIRCUIT FOR DETECTING AN ELECTRICAL INSULATION FAULT

(71) Applicant: Renault S.A.S., Boulogne-billancourt (FR)

(72) Inventors: François Gardien, Saint Martin d'uriage (FR); Thibaut Journet, Aix-les-bains (FR); Yves Le Vourch, Le Chesnay (FR); Michael Palmieri, Gieres (FR); Sophie Rivet, Guyancourt (FR)

(73) Assignee: Renault S.A.S., Boulogne-Billancourt (FR)

( * ) Notice: Subject to any disclaimer, the term of this patent is extended or adjusted under 35 U.S.C. 154(b) by 62 days.

(21) Appl. No.: 15/735,257

(22) PCT Filed: May 31, 2016

(86) PCT No.: PCT/FR2016/051293
§ 371 (c)(1),
(2) Date: Dec. 11, 2017

(87) PCT Pub. No.: WO2016/203128
PCT Pub. Date: Dec. 22, 2016

(65) Prior Publication Data
US 2018/0154776 A1    Jun. 7, 2018

(30) Foreign Application Priority Data

Jun. 15, 2015   (FR) .................................... 15 55417

(51) Int. Cl.
*B60L 3/00* (2019.01)
*G01R 27/02* (2006.01)
(Continued)

(52) U.S. Cl.
CPC ............... *B60L 3/0069* (2013.01); *B60L 3/12* (2013.01); *G01R 27/025* (2013.01); *G01R 31/007* (2013.01); *G01R 31/025* (2013.01)

(58) Field of Classification Search
CPC ....... B60L 3/0069; B60L 3/12; G01R 31/025; G01R 27/025; G01R 31/007
(Continued)

(56) References Cited

U.S. PATENT DOCUMENTS

2011/0006777 A1    1/2011  Park et al.
2013/0300430 A1   11/2013  Lindsay et al.
(Continued)

FOREIGN PATENT DOCUMENTS

FR    2976084        12/2012
FR    2995083         3/2014
WO    2014/086381     6/2014

*Primary Examiner* — Giovanni Astacio-Oquendo
(74) *Attorney, Agent, or Firm* — Occhiuti & Rohlicek LLP

(57) ABSTRACT

The invention relates to an electrical system comprising: —terminals (V+, V−) capable of being connected to an installed electrical power source (4) capable of delivering an electrical voltage between said terminals; —a circuit for detecting an electrical insulation fault between the electrical power source and a housing (14) forming a floating electrical ground. The detection circuit comprises: •a controllable voltage generator (40) capable of polarizing the housing and the single first terminal at different potentials; •a current measurement device (44) measuring current entering on said first terminal and leaving at a point of the source; •a control unit (46) capable of calculating a value of at least one insulation resistance from said at least one measured current value.

13 Claims, 3 Drawing Sheets

(51) Int. Cl.
  *G01R 31/00* (2006.01)
  *B60L 3/12* (2006.01)
  *G01R 31/02* (2006.01)
(58) Field of Classification Search
  USPC .......................................... 324/500, 509, 512
  See application file for complete search history.

(56) References Cited

U.S. PATENT DOCUMENTS

2013/0314097 A1   11/2013  Hausberger et al.
2017/0060150 A1\*  3/2017  Stefanski ................ G05D 23/27
2018/0036740 A1\*  2/2018  Nelson ..................... B02C 19/18
2018/0059176 A1\*  3/2018  Ding ................... G01R 1/0433

\* cited by examiner

ELECTRICAL SYSTEM COMPRISING A CIRCUIT FOR DETECTING AN ELECTRICAL INSULATION FAULT

RELATED APPLICATIONS

This application is the national stage under 35 USC 371 of international application PCT/FR2016/051293, filed on May 31, 2016, which claims the benefit of the Jun. 15, 2015 priority date of French Application No. 1555417, the contents of which are herein incorporated by reference.

FIELD OF INVENTION

The invention relates to the isolation of a power grid or of an electrical DC voltage power supply with respect to a voltage reference.

BACKGROUND

High-power DC voltage electrical systems are the subject of a significant development. Indeed, many transport systems include a DC power supply.

Internal combustion/electric hybrid or electric vehicles notably include high-power batteries. In order to obtain a sufficient voltage level, several electrochemical accumulators are placed in series. In order to obtain high powers and capacities, several groups of accumulators are placed in series. The number of stages (number of groups of accumulators) and the number of accumulators in parallel in each stage vary depending on the desired voltage, on the desired current and on the desired capacity for the battery. The association of several accumulators is called a battery of accumulators.

Such batteries are generally used for driving an AC electric motor by means of an inverter. The levels of voltage needed for such motors reach several hundreds of Volts, typically around 400 volts. Such batteries also comprise a high capacity in order to promote the autonomy of the vehicle in electric mode. Several technical reasons specific to their use in automobiles lead to the use of an insulation between the body, or mechanical ground, of the vehicle (formed by the chassis and the metal bodywork of the vehicle, and therefore accessible to the user) and the potentials of the battery.

SUMMARY

In one aspect, the invention features a method for detecting an insulation fault between an onboard electrical power source and a vehicle body forming a floating electrical ground.

BRIEF DESCRIPTION OF THE DRAWINGS

Other features and advantages of the invention will become more clearly apparent from the description of it presented hereinafter, by way of example and in a non-limiting manner, with reference to the appended drawings, in which.

In this description, the features and functions well known to those skilled in the art are not described in detail.

DETAILED DESCRIPTION

Figure 1:
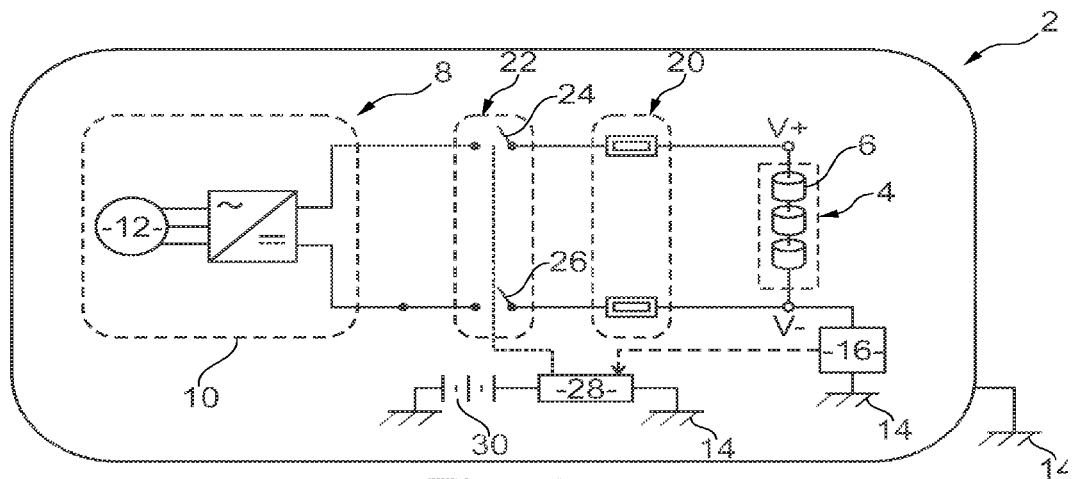
FIG. 1 shows an electric vehicle comprising an electrical DC voltage source and a circuit for detecting a fault in the electrical insulation of this source.

FIG. 1 shows schematically an electric vehicle 2, such as an electric automobile.

The vehicle 2 comprises an electrical system that provides its electrical power supply. This system comprises an onboard source 4 of electric power connected between two terminals V− and V+. The term "onboard" is understood to mean that the source 4 is not permanently connected to a power grid.

The onboard source 4 delivers a DC electrical voltage Vbat whose value is intended to remain essentially constant over time. In the illustrated embodiment, the onboard source 4 is a rechargeable battery made of accumulators 6 connected in series with one another between the terminals V− and V+ via power electrical connections.

In order to simplify FIG. 1, only three sets of accumulator 6 are drawn. In practice, however, the battery comprises a large number of accumulators 6, for example between 40 and 150 accumulators. The number of accumulators depends on the desired voltage Vbat and on the characteristics of the accumulators 6. The voltage Vbat is typically greater than or equal to 100V or to 400V when the battery is charged. In this example, the voltage Vbat is equal to 400V.

The terminals V+, V− are electrically connected to an electrical load 8 for supplying electrical power to the load 8. In this example, the load 8 comprises an inverter 10 and an electric motor 12, such as a three-phase asynchronous motor. The inverter 10 converts the DC voltage Vbat that it receives into an AC voltage for powering the motor 12. The motor 12 propels the vehicle 2.

The vehicle 2 comprises a vehicle body 14 formed by the chassis and the bodywork of this vehicle 2. These are generally composed of electrically-conducting metal. The vehicle body 14 thus forms a floating electrical ground. It is considered floating because it is not permanently electrically connected to the Earth.

The electrical system comprises a fault-detection circuit 16 for detecting an insulation fault between the onboard source 4 and the vehicle body 14. The fault-detection circuit 16 is electrically connected to the vehicle body 14 and to a single terminal of the onboard source 4, which in this case is the negative terminal V−. This fault-detection circuit 16 will be described in more detail in the following.

In the illustrated example, the vehicle 2 comprises a protection circuit 20 and a power-coupling circuit 22. The protection circuit 20 includes fuses configured so as to break the connection when there is a short-circuit. The power-coupling circuit 22 comprises switches 24, 26 that alternately connect and disconnect the terminals of the battery 4 to the inverter 10.

A battery-management system ("BMS") controls the opening and the closing of the switches 24, 26. A battery 30 supplies power for operating the BMS 28. This battery 30 also provides power for the onboard power grid of the vehicle 2. The voltage across the battery 30 is much lower than that of the onboard source 4. In the embodiment described herein, the BMS 28 is connected to the fault-detection circuit 16, for example via a data-exchange link for controlling the opening of the switches 24, 26 in case the fault-detection circuit 16 detects an insulation fault.

"Insulation fault" is understood to mean the abnormal presence of an electrical contact of low electrical resistance between the vehicle body 14 and a point of electrical potential of the onboard source 4, such as one of the terminals V+, V−. In the embodiment described herein, the resistance is considered as low if it is less than or equal to a predefined safety threshold, for example 100 k$\Omega$.

Typically, in the absence of an insulation fault, the resistance between the vehicle body 14 and any point of potential of the onboard source 4 is higher than 100 k$\Omega$ or than 1 M$\Omega$. Alternatively, this resistance may be modeled as a resistance of infinite value. Owing to this high value of resistance, no dangerous leakage current is likely to flow between the onboard source 4 and the vehicle body 14.

Figure 2:
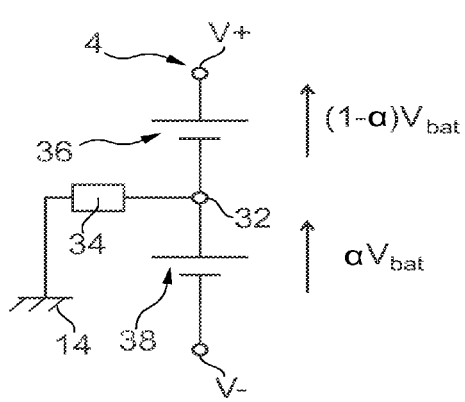
FIG. 2 shows an insulation fault in the electrical DC voltage source in FIG. 1.

FIG. 2 illustrates a single insulation fault between a point 32 of the onboard source 4 and the vehicle body 14. The result of this insulation fault is that the insulation resistance 34 connecting this point 32 and the vehicle body 14 has a value, denoted Ri, that is less than the safety threshold. A potentially dangerous leakage current flows through this insulation resistance 34 from the onboard source 4 to the vehicle body 14. Such a leakage current is undesirable because a user of the vehicle 2 who comes into direct contact with the vehicle body 14, which is connected to the bodywork of the vehicle 2, may be electrocuted.

In FIG. 2, the point 32 is situated between two adjacent accumulators of the onboard source 4. Although it is actually made of many accumulators, the onboard source 4 can be modeled as two sources of DC voltage 36, 38 connected in series with one another between the terminals V+, V− and on either side of the point 32. The sources 36, 38 deliver between their terminals voltages $(1-\alpha)*Vbat$ and $\alpha*Vbat$ respectively, where the coefficient $\alpha$ is a real number in the interval [0, 1]. The value of this coefficient $\alpha$ allows the position of the fault within the onboard source 4 to be known. More precisely, the coefficient $\alpha$ represents a barycenter of the position of the insulation faults in the onboard source 4 weighted by their respective electrical conductances.

Figure 3:
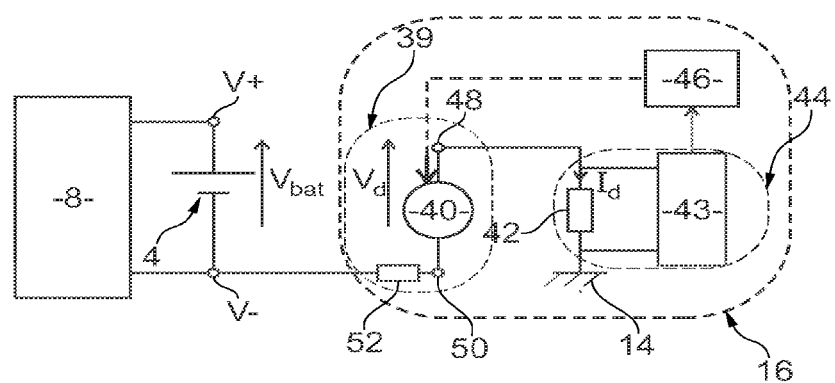
FIG. 3 shows the detection circuit in FIG. 1.

FIG. 3 shows one embodiment of the fault-detection circuit 16. This fault-detection circuit 16 comprises a voltage-application device 39, first and second resistors 42, 52, a current-measuring device 44, and a control unit 46.

The voltage-application device 39 applies a voltage between the negative terminal V− and the body where necessary to generate a potential difference across the terminals of the insulation resistance 34 and to consequently induce current through the insulation resistance 34.

The current-measuring device 44 measures an electrical current that flows across the terminal V− and the insulation resistance 34.

The role played by the first and second resistors 42, 52 and the control unit 46 will become clear in due course.

The voltage-application device 39 comprises a controllable voltage-generator 40 and the second resistor 52. The voltage generator 40 imposes a controlled potential difference between its terminals. It is therefore quite unlike the passive resistances encountered in the prior art. The generator 40 applies a voltage Vd between first and second poles 48, 50 thereof as a function of a control signal received on its control interface. In this example, the voltage Vd is a DC voltage. The value of Vd is preferably less than or equal to 50V, for example in the range between 0V and 24V. The voltage Vd is applied in such a manner that the first pole 48 of the generator 40 has an electrical potential higher that is than that of the second pole 50 when the voltage Vd is positive.

In the embodiment described herein, the first resistor 42 and the generator 40 are connected in series with one another between the terminal V− and the vehicle body 14.

In this example, the first resistor 42 connects between the first pole 48 and the vehicle body 14. The second pole 50 of the generator 40 connects to the negative terminal V− as will be seen hereinafter. Thus, the application of the voltage Vd leads to electrical current Id flowing through the current-measuring device 44 and the insulation resistance 34. This current Id is not however considered to be a leakage current.

The second resistor 52 connects between the terminal V− and the first pole 48. The second resistor 52 promotes better isolation between the onboard source 4 and the rest of the fault-detection circuit 16 to avoid the value of the current Id growing too high and posing a danger to a user. The value, denoted Rd, of the resistance of the second resistor 52 is for example chosen to be as low as possible in order to facilitate the measurement of the current Id while at the same time being sufficiently high so as not to degrade the electrical isolation of the fault-detection circuit 16. A resistance Rd will preferably be chosen higher, for example 5 times, or even 10 times higher, than an abnormal value of insulation resistance for example of the order of 100 kOhms, for a voltage of 400V, leading to a maximum acceptable current of 4 mA, where the highest maximum acceptable current commonly admitted for personal safety is of the order of 10 mA. For example, the value Rd is thus equal to 500 k$\Omega$.

The resistance of the first resistor 42, denoted Rs, is advantageously chosen such that the ratio Rd/Rs is in the range between 1 and 100 or between 10 and 50. This ratio of Rd/Rs allows the values of current Id, and therefore the voltages measured by the current-measuring device 44, to be maintained within a narrow range. This simplifies the design of the current-measuring device 44. In particular, it is not necessary to galvanically isolate the current-measuring device 44 if the voltage measured by the current-measuring device 44 remains less than or equal to 20V or to 10V. For example, with the voltage Vbat equal to 400V and a ratio Rd/Rs equal to 100, the voltages measured by the current-measuring device 44 are lower than 4V or 5V.

The current-measuring device 44 is designed to measure the current Id that is flowing through the second resistor 52 (Rd), the generator 40, the first resistor 42 (Rs), the insulation resistance 34 and a part of the onboard source 4 situated between the point 32 and the terminal V−. The current-measuring device 44 comprises for example the first resistor 42 and an analog/digital converter 43 using differential amplifiers, electrically connected in parallel with the first resistor 42. In the embodiment described herein, the current-measuring device 44 therefore measures an electrical potential difference Vmes across the terminals of the first resistor 42. The value of the current flowing through the first resistor 42 is automatically deduced from this using the prior knowledge of the value Rs.

The control unit 46 is designed to automatically: control the successive application, by the generator 40, of different values of the voltage Vd; acquire, for each of the voltage values Vd applied by the generator 40, the corresponding value of the current Id, measured by the current-measuring device 44; and calculate the value of the insulation resistance 34 associated with the insulation fault using the acquired current values Id and the applied voltage values Vd.

For example, the control unit 46 comprises a microprocessor and communication interfaces with the generator 40 and the current-measuring device 44.

In this example, it is considered there is only one insulation fault, situated at the point 32. Two different values of voltage Vd are applied, denoted Vd1 and Vd2, by the generator 40. To each of these values corresponds a current Id1 and Id2 flowing through the first resistor 42. Then, the value Ri of the insulation resistance 34 is calculated by means of the following formula:

$$Ri=(Vd1-Vd2)/(Id2-Id1)-(Rd+Rs).$$

However, in practice, the value Rs may be neglected compared with the value Rd, and this formula may be simplified in the following manner:

$$Ri=(Vd1-Vd2)/(Id2-Id1)-Rd \qquad \text{[equation 1]}$$

The value of the coefficient α may also be calculated by means of the following formula:

$$\alpha=(Id2*Vd1-Id1*Vd2)/(Id2*Vbat-Id1*Vbat) \qquad \text{[equation 2]}$$

Figure 4:
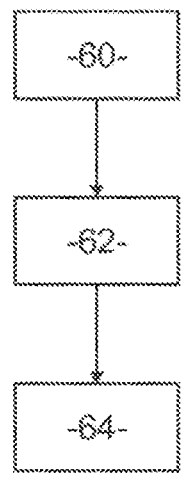
FIG. 4 shows one example of a method of use of the circuit in FIG. 3 for detecting an insulation fault.

FIG. 4 describes one example of operation of the system for detecting the insulation fault.

During a first step 60, the generator 40 is controlled by the control unit 46 for applying the voltage Vd1 between the poles 48 and 50. While this voltage Vd1 is applied, the current-measuring device 44 measures the current Id1 and transmits the measured value to the control unit 46. Advantageously, during this step, the current Id1 is left to stabilize prior to measuring it. For example, a certain predetermined time delay is allowed after the application of Vd1 before the current-measuring device 44 measures the current Id1. Indeed, when the current Id1 is injected (here by applying the voltage Vd1), the latter initially has a phase referred to as transient regime, during which its value varies significantly, followed by a phase referred to as permanent regime, during which its value stabilizes around an essentially constant value. It is preferable to wait for the permanent regime to be established before carrying out the measurement of Id1 since the precision of the measurement is then better. The value of the predetermined time delay depends on the way in which the voltage Vd varies over time and also on the fault-detection circuit 16. The duration of the transient phase depends on the value of the capacitances present between the onboard source 4 and the vehicle body 14. The choice of the predetermined time delay therefore depends indirectly on the value of these capacitances.

Figure 5:
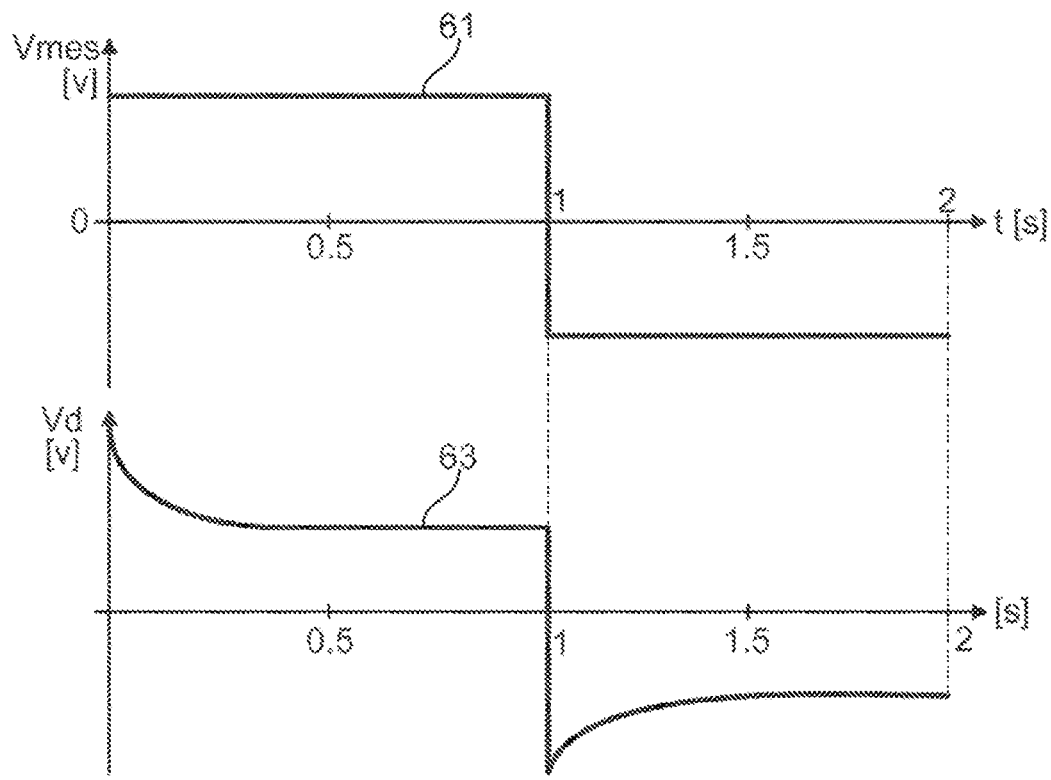
FIG. 5 shows the time variation profile of a quantity representative of the electrical current flowing in an insulation resistance of the vehicle in FIG. 1 in response to a current injected by the detection circuit in FIG. 1.

FIG. 5 illustrates, by way of example, the variation profile (curve 63) over time t (in seconds) of the measured voltage Vmes (therefore, indirectly, of the current Id1) in response to the applied voltage Vd (curve 61) which varies periodically as a square wave with a frequency equal to 0.5 Hz. In this example, the predetermined time delay is chosen to be equal to 750 ms.

Subsequently, during a second step 62 (FIG. 4), the generator 40 is controlled by the control unit 46 for applying the voltage Vd2 between the poles 48 and 50. While this voltage Vd2 is applied, the current-measuring device 44 measures the current Id2 and transmits the measured value to the control unit 46. Advantageously, as for the current Id1, the value of the current Id2 is allowed to stabilize prior to measuring it.

Lastly, during a step 64, the resistance Ri is automatically calculated by the unit 16, using the values Vd1, Vd2, Id1 and Id2, by virtue of the equation 1 previously defined.

Advantageously, during this step, the coefficient α is also calculated by means of the equation 2 previously defined.

The fault-detection circuit 16 can thus be connected to a single terminal of the onboard source 4. Its integration within the vehicle 2 is thus accordingly facilitated, notably with respect to the known circuits for detecting an insulation fault based on a measurement of resistance by means of a voltage divider which require a connection to both terminals of the battery.

The fault-detection circuit 16 furthermore allows reliable detection of an insulation fault, in particular with respect to the known methods which use a capacitor for injecting a current. Indeed, the latter see their precision limited because of the fluctuation over time of the properties of the capacitor.

Lastly, the fault-detection circuit 16 allows information to be obtained on the position of the insulation fault, thanks to the calculation of the coefficient α. This is particularly useful in the case where the onboard source 4 is composed of multiple accumulators 6. Indeed, the accumulators 6 within a battery typically each have the same voltage. By virtue of the coefficient α, it can be detected at which point in the assembly of these accumulators the insulation fault is located. The diagnostic and the repair of the insulation fault are accordingly thus improved. For example, each accumulator 6 generates a voltage Vcell. The position of the fault can be determined by comparing the quantities α*Vbat and X*Vcell, where X is an integer.

Figure 6:
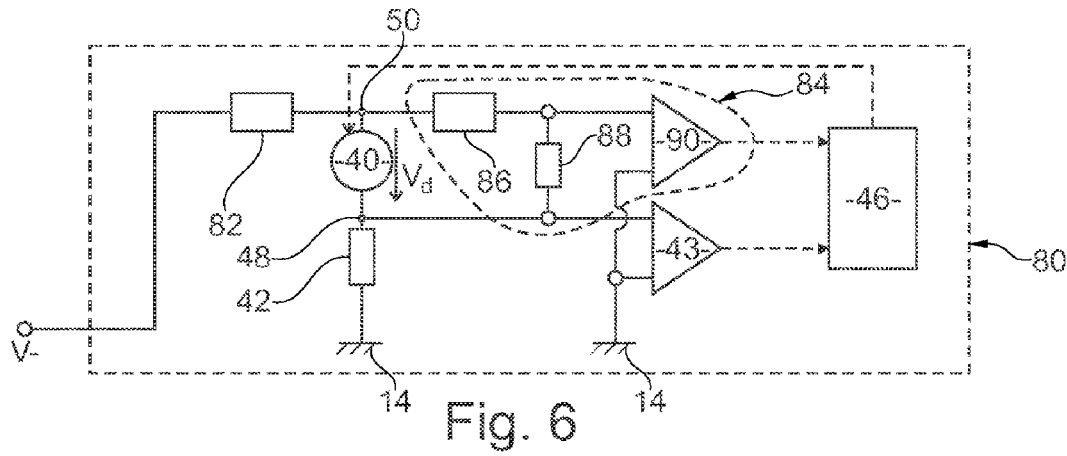
FIG. 6, another embodiment of the detection circuit in FIG. 3.

It will be noted, in the example shown in FIG. 3, that the voltage Vd may be positive or negative. With the aforementioned chosen convention, when the voltage Vd is positive, the current Id can flow in one direction or in the other, depending on the positioning of the point 32 within the onboard source 4, and the potential of the body may be lower than or higher than that of the terminal V− depending on the case. Such a two-fold possible choice of direction for the current may complicate the implementation of the generator 40 and of the measurement circuit 44. In order to avoid this potential difficulty, it may be envisioned to apply a negative voltage Vd. Thus, the current Id will always flow in the same direction (the current Id indicated in FIG. 3 will then be negative). FIG. 6 shows a replacement fault-detection circuit 80 designed to replace the fault-detection circuit 16. This replacement fault-detection circuit 80 is for example identical to the fault-detection circuit 16, except that it furthermore comprises a resistor 82, via which the terminal V− is electrically connected to the pole 50 of the generator 40. This resistor 82 here plays the same role as the second resistor 52. The value Rd of the resistor 82 is preferably chosen in the same way as for the second resistor 52. The same is true for the value Rs of the first resistor 42. In this example, Rs is equal to 5 kΩ and Rd is equal to 500 kΩ. It will be noted that, as previously for FIG. 3, the current Id is the current flowing through the first resistor 42 (Rs) and that it is considered as positive when it flows from the generator 40 to the vehicle body 14.

On the other hand, the replacement fault-detection circuit 80 furthermore comprises a voltage-measurement device 84 for measuring the voltage Vd that is applied by the generator 40.

The voltage-measurement device 84 is particularly useful when the value of Vd applied by the generator 40 is low and when there is a risk of having a difference between the setpoint value of Vd and the value Vd actually applied. This could render the calculation of Ri erroneous. The voltage-measurement device 84 allows the calculations to use the value of Vd that is actually applied.

In the embodiment described herein, the voltage-measurement device 84 comprises first and second resistors 86, 88, connected in series with one another between the first and second poles 48, 50 so as to form a voltage divider and a voltage sensor 90.

In some embodiments, the sensor 90 comprises an analog/digital voltage converter. The resistances of the first and second resistors 86, 88, respectively denoted Rp1 and Rp2, are preferably chosen to limit the values of voltage measured by the sensor 90.

Furthermore, the first and second resistors 86, 88 are also used to enable a flow of the electrical current Id in both directions. More precisely, the generator delivers a current (I0+Id) which may be divided, on the one hand, into a biasing current I0 that flows in the first and second resistors 86,88 and, on the other hand, into a current Id that flows in the first resistor 42 (the onboard source 4 and the insulation resistance 34). The biasing current I0 is provided to be higher in absolute value than the current Id such that the current I0+Id always flows in the same direction, which is favorable for the generator 40. The voltage across the terminals of the resistor 88 is thus always biased in the same direction, which facilitates the design of the circuit 90. The current Id may, on the other hand, be positive or negative depending on the sign of the voltage Vd and the location of the insulation fault.

It will be noted that, in the case where the onboard source 4 is tested, as previously explained, it may be preferable to choose a negative voltage Vd such that the current Id is always negative. This facilitates the design of the circuit 43.

In the example described herein, the values Rp1 and Rp2 are respectively equal to 5 kΩ and 1 kΩ. This means that the voltage measured by the sensor 90 stays in the range between 0V and 5V.

In this way, a sensor 90 of simpler design can be used. For example. For example, it is not necessary to have to include a differential converter of differential amplifier.

In the embodiment described herein, the sensor 90 does not directly measure the voltage Vd. It measures the value Vd*Rp1/(Rp1+Rp2)+Vmes, Vmes being the voltage value measured by the current-measuring device 44. However, the value of Vd may be simply calculated using the value measured by the sensor 90, by the current-measuring device 44 and with the aid of the values of Rp1 and Rp2 which are known.

Furthermore, in the replacement fault-detection circuit 80, in the case where the value of Vd is negative, it is possible to detect an insulation fault in the load 8, in particular when this load comprises the inverter 10 and when the latter is inoperative, as will be seen in detail in the following.

Figure 7:
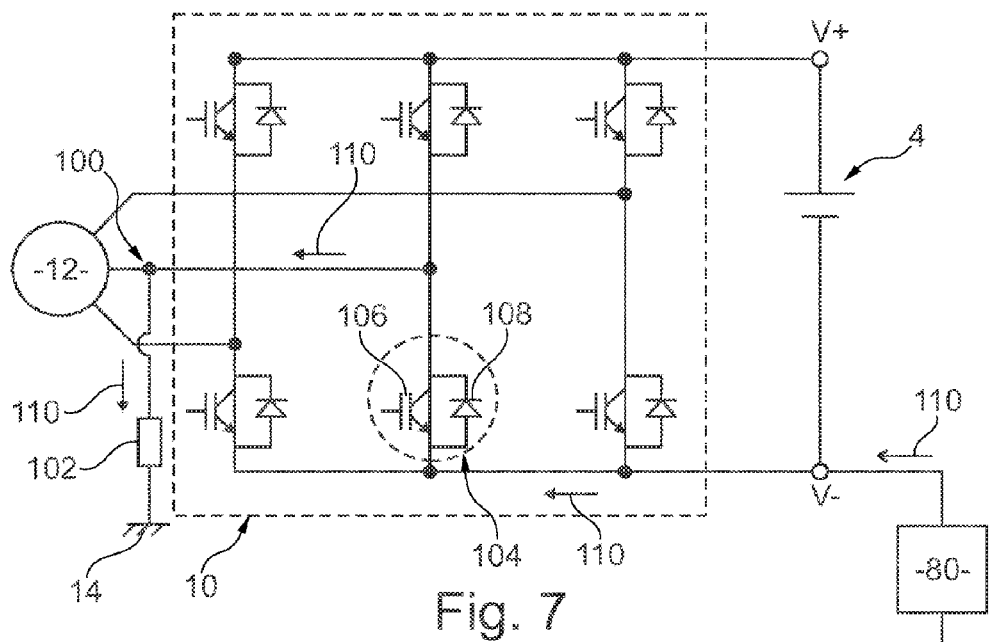
FIG. 7 shows the use of the detection circuit in FIG. 6 for detecting an insulation fault in a circuit comprising an inverter.

FIG. 7 shows a portion of the inverter 10 used in the vehicle 2. The inverter 10 is electrically powered on a DC voltage input interface by the onboard source 4. The inverter 10 delivers, on an output interface, a three-phase AC voltage for supplying power to the motor 12 by means of electrical connectors, each corresponding to one phase of this voltage. In the embodiment described herein, an insulation fault is present on one of the phase connectors between a point 100 of this connector and the vehicle body 14. A resistance 102 of value Ri', is associated with this insulation fault.

In a known manner, the inverter 10 comprises controllable power switches 104. The successive switching of these switches 104 provides the operation of the inverter 10. In the embodiment described herein, each of the switches 104 comprises a power transistor 106 and a flyback diode 108.

The power transistor 106 is, for example, an IGBT (Isolated Gate Bipolar Transistor). The flyback diode 108 is electrically-connected between a collector and an emitter of this transistor.

An inverter comprises a device for controlling and synchronizing the switching of the switches 104 by delivering a control signal to a gate of the transistors 106. To avoid cluttering FIG. 7, this device is not however illustrated.

By virtue of the reversing of the polarity of the voltage Vd applied by the generator 40, the replacement fault-detection circuit 80 allows a current Id to be generated in a direction that is opposite to the direction in which the currents flow under normal conditions in the inverter 10. The direction and the path of this current Id is represented by the arrows 110. More precisely, this current Id flows within the inverter 110 until it reaches the point 100 and flows through the resistance 102, going via one or more of the switches 106. Typically, when the inverter 10 is inoperative, the transistors 106 are open and do not allow the passage of the current. However, the current can flow through the diode 108 owing to its reversed direction of flow.

According to another embodiment, the circuits 16 and 80 are not limited to the case where there is only one fault and may be used for detecting the presence of several faults simultaneously present.

Figure 8:
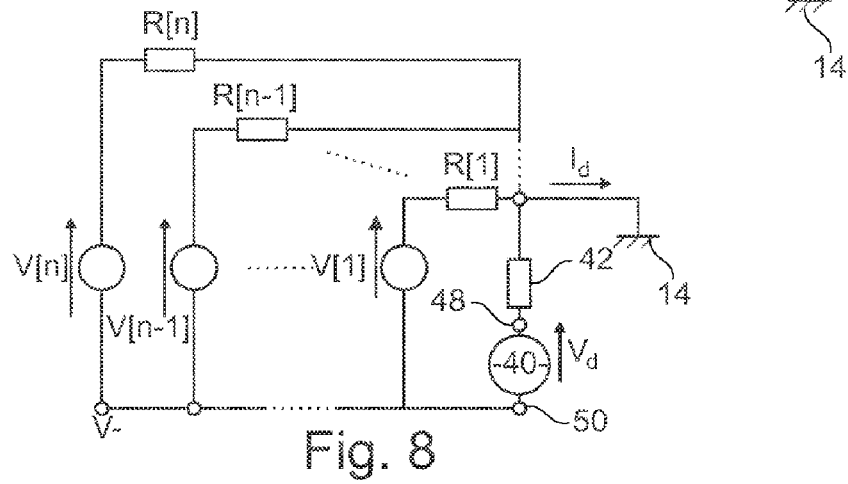
FIG. 8 shows insulation faults in the electrical DC voltage source in FIG. 1.

FIG. 8 shows an equivalent electrical circuits for the onboard source 4 and for the fault-detection circuit 16 in the presence of a number n of insulation faults simultaneously and at several separate points of the onboard source 4. In the embodiment described herein, the n is an integer greater than or equal to one. In the embodiment described herein, each of these faults is modeled as a voltage source V[i] and a resistance R[i] of finite value connected in series with each another and between the terminal V− and the vehicle body 14, where i is an integer index in the range between 1 and n. These faults are connected in parallel with one another between the vehicle body 14 and the terminal V− of the onboard source 4. Preferably, the resistances R[i] each have a value less than or equal to n*1 MΩ, in such a manner that the value of the resistance equivalent to these resistances R[i] in parallel is less than or equal to 1 MΩ or to 100 kΩ. For simplification, only a part of the fault-detection circuit 16, comprising the source 40 and the first resistor 42, is shown in this FIG. 8. In particular, the second resistor 52 is not shown.

The value of the current Id in the presence of a voltage Vd is given by the following formula:

$$Id = \left( \frac{\sum_{i=1}^{n} \frac{V[i]}{R[i]} + \frac{Vd}{Rd}}{\sum_{i=1}^{n} \frac{1}{R[i]} + \frac{1}{Rd}} \right) * \frac{1}{Rd} \quad \text{[equation 3]}$$

The values of the voltages V[i] and of the resistances R[i] may be calculated by applying 2*n different values of Vd and by measuring the value of the current Id for each of them. Starting from the equation 3, a system of 2*n equations with 2*n unknowns is then obtained that may be solved in order to obtain the n values of the voltages V[i] and of the resistances R[i]. The control module 46 is configured accordingly in order to automatically carry out this calculation.

The number of unknowns in the system of equations may be reduced if certain assumptions are made on the localization of the insulation faults. For example, it is considered that the insulation faults can only occur at the terminal V+ or V−, or else in the connectors between accumulators of the battery forming the onboard source 4. The number of values of voltage Vd to be applied is thus reduced.

For example, in the particular case where n=2, it may be considered that the insulation faults only occur at the terminals V+ and V− of the source. This corresponds to the following conditions: V[1]=Vbat and V[2]=0V. Only two values of Vd, denoted Vd1 and Vd2, are then needed to calculate the insulation resistances R[1] and R[2] respectively associated with these two faults, by means of the following formulae:

$$R[1]=[(Vd1-Vd2)/(Id2-Id1)-Rd]/\alpha \quad \text{[equation 4]}$$

$$R[2]=[(Vd1-Vd2)/(Id2-Id1)-Rd]/(1-\alpha) \quad \text{[equation 5]}$$

where $\alpha=R'i/R[1]$, R'i being the value of the equivalent resistance such that $1/R'i=1/R[1]+1/R[2]$. The expression for the coefficient $\alpha$ is for example that given by the equation 2 previously described.

In practice, as the number n of faults is generally not known in advance, it is possible to choose a number m of distinct values of Vd applied by the generator 40. This number m is not necessarily equal to 2*n. The number m is advantageously chosen as a function of the precision that it is desired to obtain.

For example, the detection method is first of all implemented with m=1 then it is repeated for increasing values of m.

If n is greater than one, then the calculation for m=1 allows characteristics (values of insulation resistance Ri and of the coefficient $\alpha$) of a single fault equivalent to the n faults to be obtained. The repetition of the method with larger values of m allows the precision of the calculated characteristics for these faults to be refined. The method can then continue to be applied, successively, with higher values of m, until the measurements do not provide any gain in precision. This means that the n faults have been identified.

Conversely, in the case where the probability of appearance of an insulation fault inside of the onboard source 4 is low and where the risk of an insulation fault relates mainly to the terminals V+ and V−, a simplified detection will be able to be carried out. As a first step, it could for example be sought to detect whether a fault is present on the terminal V+, by not applying a voltage by the generator (Vd zero, a current being able to flow through the generator, or through the biasing resistors in parallel with the generator as in FIG. 6). A current can thus flow from the terminal V+ to the body, through the "upper" insulation resistance between the terminal V+ and the body, then flow back to the terminal V− through the second resistor 52 (or 82) and the first resistor 42. If the upper insulation resistance is low enough, then it will be possible to detect a current by the current-measuring device 44. If no current is detected, then it may be concluded from this that the upper insulation, at the terminal V+, is good. The insulation at the terminal V− can subsequently be tested. It will be noted, first of all, that if the "lower" insulation resistance between the terminal V− and the body is sufficiently low (notably with respect to the upper insulation resistance), the potential of the terminal V− will tend to be identical to that of the body and no current will flow "naturally" through the generator 40 and the second resistors 52 (or 82) and the first resistor 42. The application of a voltage Vd, non-zero, by the generator 40 then allows the "forced" application of a potential difference between the terminal V− and the body and, thus, a non-zero current Id will be established and will be able to be measured by the current-measuring device 44.

Numerous others embodiments are possible.

The electrical system comprising the onboard source 4 and the fault-detection circuit 16 is not limited to the automobile vehicle 2 and may be implemented in many other electrically powered systems for detecting an insulation fault between a terminal of the onboard source 4 and a body forming a floating electrical ground of this system. The same is true for the replacement fault-detection circuit 80. Notably, the use of the replacement fault-detection circuit 80 in conjunction with the inverter 10 is not limited to the automobile vehicle 2 and/or to the motor 12.

The onboard source 4 may be different; it may, by way of example, comprise one or more super-capacitors. It may also comprise a DC voltage generator such as a photovoltaic panel or else a fuel cell equipped with a fuel tank.

The value of the voltage Vbat may be different. As a variant, the onboard source 4 does not deliver a DC voltage. For example, the voltage Vbat is not constant but fluctuates over time. For example, the voltage Vbat fluctuates within a range of voltages included between Vbat1 and Vbat2, where Vbat1 is equal to 200V and Vbat2 is equal to 350V. In this case, the calculation of the values of Ri and of the coefficient $\alpha$ is modified accordingly. For example, the equation 2 previously described is modified as follows: $\alpha=(Id2*Vd1-Id1*Vd2)/(Id2*Vbat1-Id1*Vbat2)$.

Preferably, the value of the voltage Vbat fluctuates with a frequency less than or equal to 50 Hz or to 100 Hz.

As a variant, the voltage Vbat is an AC voltage.

The load 8 may be different; for example, it may consist of a DC electric motor.

The inverter 10 may take a different form. In particular, the switches 104 may be different. For example, the transistors 106 are power MOSFETs ("metal-oxide semiconductor field effect transistor"). In this case, the diode 108 is formed within the component, in a known manner, by interfaces of layers of semiconductor material which form this transistor. The diode 108 is not then necessarily formed by a discrete component. Other types of transistors may also be used. The insulation fault may be situated at a different location, for example, within the motor 12.

The fault-detection circuit 16 may be connected between the vehicle body 14 and the terminal V+. In this case, the connection of the voltage-application device 39 is modified as a result.

The first resistor 42 may be placed differently within the circuit. For example, the pole 48 is connected to ground and the resistor is connected between the pole 50 and the terminal V− of the onboard source 4.

The current-measuring device 44 may be different. For example, the current-measuring device 44 comprises a Hall-effect current sensor or a Neel-effect current sensor which replaces the first resistor 42 and the converter 43.

The values of Ri, Rd, Rs may be different. Similarly, the value of Rd and the value of the ratio Rd/Rs may be different.

The management unit 28 may be electrically connected to one terminal of the onboard source 4, preferably that to which the fault-detection circuit 16 or 80 is connected.

The voltage-application device 39 may be different. For example, the generator 40 and the second resistor 52 are replaced by a equivalent circuit (Norton theorem) comprising a current source electrically connected in parallel with a resistor between the vehicle body 14 and the terminal V−.

The steps 60, 62 and 64 may be implemented in a different manner, in particular when there is more than one fault.

The voltage-measurement device 84 may be composed in a different manner.

The resistors 86, 88 may be omitted.

The insulation fault may be elsewhere than inside of the onboard source 4.

Advantageously, it is possible to vary the value of Vd step by step until a current Id of zero is measured. It is known that the fault is reached when Id=0.

The voltage Vd may take different values, for example higher than 24V. It may be advantageous to choose high values of Vd, since this increases the precision of the measurements of Id. However, this has an impact on the characteristics required for the current-measuring device 44. A compromise will therefore be sought between the precision of the measurements of Id and the simplicity of implementation of the circuits 16 or 80.

The invention claimed is:

1. An apparatus comprising an electrical system, wherein said electrical system comprises first and second terminals and a detection circuit, wherein said first and second terminals are configured to connect to an onboard power source that maintains a voltage between said first and second terminals, wherein said detection circuit detects an insulation fault between said onboard power source and a vehicle body that forms a floating electrical ground, wherein said insulation fault corresponds to an abnormal value of an insulation resistance between said vehicle body and a point on said onboard power source, wherein said detection circuit comprises a programmable voltage-generator, a current-measurement device, and a control unit, wherein said programmable voltage-generator connects to said vehicle body and a first terminal wherein said programmable voltage-generator biases said vehicle body and said first terminal at different potentials, wherein said current-measurement device measures an incoming current into said first terminal and an outgoing current across said a point on said onboard power source, wherein said current flows through said insulation resistance, and wherein said control unit controls application, by said programmable voltage-generator, of at least one non-zero voltage value between said vehicle body and said first terminal, acquires a value of said current measured by said current-measurement device for each value of voltage applied, and calculates a value of said insulation resistance based at least in part on said measured value of said current.

2. The apparatus of claim 1, further comprising a first resistor having a first resistance, wherein said first resistor and said programmable voltage-generator are connected in series between one of said first and second terminals and said vehicle body, wherein said first protection resistance is greater than said abnormal value.

3. The apparatus of claim 2, wherein said detection circuit is configured to detect first and second insulation faults between said voltage source and said vehicle body, wherein said control unit is configured to calculate a first insulation resistance associated with said first insulation fault and a second resistance associated with said second insulation fault, wherein said first resistance is obtained by dividing said insulation resistance by a coefficient that is between zero and unit, and wherein said second resistance is obtained by dividing said insulation resistance by an extent to which said coefficient is less than unity.

4. The apparatus of any one of claim 2, wherein said current-measurement device comprises a second resistor and a voltage-measurement device, wherein said voltage-measurement device measures a voltage across said second resistor, and wherein said first resistor, said second resistor, and said programmable voltage-generator are placed in series between said vehicle body and said first terminal.

5. The apparatus of claim 4, wherein said second resistor has a second resistance, and wherein a ratio of said first resistance to said second resistance is between 10 and 100.

6. The apparatus of claim 2, wherein said current-measurement device comprises a second resistor that is placed in series with a first resistor having a first resistance and said programmable-voltage-generator between said vehicle body and said first terminal and a differential amplifier that measures a voltage across said second resistor, wherein said abnormal value is less than said first resistance.

7. The apparatus of claim 1, further comprising a first resistance provided by a first resistor that is connected in series with said programmable voltage-generator between said vehicle body and said terminals, wherein said control unit is configured to calculate said insulation resistance associated with a single equivalent insulation fault by subtracting said first protection resistance from a quotient, wherein said quotient is a numerator divided by a denominator, wherein said numerator is a difference between a first voltage and a second voltage, wherein said denominator is a difference between a first current and a second current, wherein said first and second voltages are successively applied by said programmable voltage-generator, wherein said first resistance exceeds said abnormal value, wherein said first current is that current that results from having applied said first voltage, and wherein said second current is that current that results from having applied said second voltage.

8. The apparatus of claim 1, wherein said programmable voltage-generator applies a voltage between first and second poles thereof, wherein said first pole connects to said first terminal, wherein said second pole connects to said vehicle, wherein said terminals comprise a positive and negative terminal, wherein said first pole of said programmable voltage-generator has an electrical potential higher or lower than that of said second pole when said programmable voltage-generator applies a voltage according to, respectively, whether said programmable voltage-generator is connected to said negative terminal or said positive terminal, wherein said connection results in said potential of said vehicle body being respectively lower than that of said negative terminal or higher than that of said positive terminal.

9. The apparatus of claim 1, further comprising a voltage-measurement device configured to measure a voltage provided by said programmable voltage-generator.

10. The apparatus of claim 1, further comprising a voltage-measurement device, a third resistor, and a fourth resistor, wherein said voltage-measurement device is configured to measure a voltage provided by said programmable voltage-generator, wherein said third and fourth resistors are connected in series with one another between first and second poles of said programmable voltage-generator, wherein said third and fourth resistors form a voltage divider, and wherein said voltage-measurement device is electrically connected to a median point of said voltage divider.

11. The apparatus of claim 1, wherein said programmable voltage-generator is configured such that an absolute value of said applied voltage is greater than or equal to zero volts and less than or equal to twenty-four volts.

12. The apparatus of claim 1, wherein said programmable voltage-generator is configured to apply a DC voltage.

13. A method comprising using said apparatus of claim 1 for detecting an insulation fault between said onboard power source and said vehicle body, wherein using said apparatus comprises causing said programmable voltage programmable voltage-generator to apply at least one non-zero voltage between said vehicle body and said first terminal, acquiring a value of measured current for each value of said applied voltage, and calculating said value of said insulation resistance based at least in part on said measured value.

* * * * *